(12) United States Patent
Lee et al.

(10) Patent No.: US 7,112,539 B2
(45) Date of Patent: Sep. 26, 2006

(54) DIELECTRIC LAYER FOR SEMICONDUCTOR DEVICE AND METHOD OF MANUFACTURING THE SAME

(75) Inventors: Jongho Lee, Kiheung-Eup youngin (KR); Nae-In Lee, Seoul (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 0 days.

(21) Appl. No.: 10/999,608

(22) Filed: Nov. 29, 2004

(65) Prior Publication Data
US 2005/0074982 A1   Apr. 7, 2005

Related U.S. Application Data

(62) Division of application No. 09/776,059, filed on Feb. 2, 2001, now Pat. No. 6,844,604.

(51) Int. Cl.
*H01L 21/31* (2006.01)
*H01L 21/469* (2006.01)

(52) U.S. Cl. .................. 438/763; 438/785; 438/786; 257/E21.15; 257/E21.16

(58) Field of Classification Search .............. 438/763, 438/785, 786; 257/E21.159, E21.16
See application file for complete search history.

(56) References Cited

U.S. PATENT DOCUMENTS

| | | | |
|---|---|---|---|
| 5,923,056 A | 7/1999 | Lee et al. | |
| 6,013,553 A | 1/2000 | Wallace et al. | |
| 6,020,024 A | 2/2000 | Maiti et al. | |
| 6,020,243 A | 2/2000 | Wallace et al. | |
| 6,060,755 A | 5/2000 | Ma et al. | |
| 6,088,216 A * | 7/2000 | Laibowitz et al. | 361/321.4 |
| 6,407,435 B1 | 6/2002 | Ma et al. | |
| 6,563,183 B1 * | 5/2003 | En et al. | 257/410 |
| 6,664,186 B1 | 12/2003 | Callegari et al. | |
| 6,841,439 B1 * | 1/2005 | Anthony et al. | 438/216 |
| 2003/0152813 A1 * | 8/2003 | Paz de Araujo et al. | 428/701 |
| 2004/0183142 A1 * | 9/2004 | Matsuo et al. | 257/406 |

FOREIGN PATENT DOCUMENTS

| | | |
|---|---|---|
| EP | 0851473 A2 | 1/1998 |
| WO | WO 00/01008 | 1/2000 |

OTHER PUBLICATIONS

G.D. Wilk and R. M. Wallace "Electrical Properties of Hafnium Silicate Gate Dielectrics Deposited Directly on Silicon" Applied Physics Letters; pp. 2854-2856 (199).

* cited by examiner

*Primary Examiner*—Caridad Everhart
(74) *Attorney, Agent, or Firm*—Marger Johnson & McCollom, P.C.

(57) ABSTRACT

A multi-layer dielectric layer structure for a semiconductor device. The multi-layer dielectric layer structure comprises a silicate interface layer having a dielectric constant greater than that of silicon nitride and a high-k dielectric layer overlying the silicate interface layer. The high-k dielectric layer comprises one or more ordered pairs of first and second layers. With the present invention, the dielectric constant of the high-k dielectric layer can be optimized while improving interface characteristics. With a higher crystallization temperature realized by forming the multi-layer structure, each of whose layers is not more than the critical thickness, leakage current can be reduced, thereby improving device performance.

22 Claims, 6 Drawing Sheets

Al2O3 MOS Capacitor C-V Curves
(a) n+Poly-Si/ Al2O3 or SiO2/ p-Si  (b) p+Poly-Si/ Al2O3 or SiO2/ n-Si  (c) n+Poly-Si/ Al2O3 or SiO2/ p-Si  (d) n+Poly-Si/ Al2O3 or SiO2/ n-Si Gm(Normalized Transcoductance) vs. Vg
(a) N+Gate nMOS (b) P+Gate pMOS
(c) In-situ Doped N+Gate nMOS
(d) In-situ Doped N+Gate pMOS Flatband Voltage Shift vs. Relative Gm of $Al_2O_3$ to $SiO_2$ Gate Base Level VL vs. Charge Pumping Current Icp C-V Curve of $ZrO_2/Al_2O_3$ Stack layer

DIELECTRIC LAYER FOR SEMICONDUCTOR DEVICE AND METHOD OF MANUFACTURING THE SAME

This application is a divisional of U.S. patent application Ser. No. 09/776,059, filed Feb. 2, 2001, now U.S. Pat. No. 6,844,604 which is incorporated herein by reference in their entirety.

BACKGROUND OF THE INVENTION

1. Field of the Invention

This invention relates generally to the field of semiconductor devices, and more particularly, to a dielectric layer structure and a method of manufacturing the same.

2. Description of the Related Art

With each generation of metal oxide semiconductor (MOS) integrated circuit (IC), the device dimensions have been continuously scaled down to provide for high-density and high-performance devices. Particularly, the thickness of gate dielectrics is made as small as possible because the drive current in a MOS field effect transistor (FET) increases with decreasing gate dielectric thickness. Thus, it has become increasingly important to provide extremely thin, reliable, and low-defect gate dielectrics for improving device performance.

For decades, a thermal oxide layer, e.g. silicon dioxide ($SiO_2$), has been used as the gate dielectrics because the silicon dioxide thermal oxide layer is stable with the underlying silicon substrate and the fabrication process is relatively simple.

However, because the silicon dioxide gate dielectrics has a low dielectric constant (k), e.g., 3.9, further scaling down of silicon dioxide gate dielectric thickness has become more and more difficult, especially due to gate-to-channel leakage current through thin silicon dioxide gate dielectrics.

This leads to consideration of alternative dielectric materials that can be formed in a thicker layer than silicon dioxide but still produce the same or better device performance. The performance can be expressed as "equivalent oxide thickness (EOT)."

This is mainly because the physically thicker metal oxide can reduce gate-to-channel leakage current while the device performance is not adversely impacted. Further, if the dielectric layer can be made sufficiently thick, etching margin can be increased during the patterning of gate stacks. This increased etching margin prevents the silicon substrate from being exposed by the etching process for patterning the gate stacks.

To this end, a high-k (high dielectric constant) metal oxide materials have been proposed as the alternative dielectric materials for gate or capacitor dielectrics. Because the dielectric constant of a metal oxide material can be made greater than that of the silicon dioxide, a thicker metal oxide layer having a similar EOT can be deposited.

Unfortunately, the use of high-k metal oxide materials presents several problems when using traditional substrate materials such as silicon. The silicon can react with the high-k metal oxide or oxidize during deposition of the high-k metal oxide or subsequent thermal processes, thereby forming an interface layer of silicon dioxide. This increases the equivalent oxide thickness, thereby degrading device performance.

Further, an interface trap density between the high-k metal oxide layer and the silicon substrate is increased. Thus, the channel mobility of the carriers is reduced. This reduces the on/off current ratio of the MOS transistor, thereby degrading its switching characteristics.

Also, the high-k metal oxide layer such as a hafnium oxide ($HfO_2$) layer or a zirconium oxide ($ZrO_2$) layer has a relatively low crystallization temperature and is thermally unstable. Thus, the metal oxide layer can be easily crystallized during a subsequent thermal annealing process for activating the impurities injected into source/drain regions. This can form grain boundaries in the metal oxide layer through which current can pass. And the surface roughness of the metal oxide layer increases, deteriorating the leakage current characteristics. Further, the crystallization of the high-k metal oxide layer undesirably affects a subsequent alignment process due to irregular reflection of the light on an alignment key having the rough surface.

Various attempts have been made to address the above-mentioned problems. For example, U.S. Pat. No. 6,020,024 discloses an oxynitride layer interposed between a silicon substrate and a high-k dielectric layer. U.S. Pat. No. 6,013,553 discloses a zirconium oxynitride layer or a hafnium oxynitride layer as the gate dielectrics. Further, PCT International Patent Application Publication No. WO 00/01008 discloses $SiO_2$, silicon nitride and oxynitride interface layers. Also, U.S. Pat. No. 6,020,243 discloses a high permittivity zirconium (or hafnium) silicon-oxynitride gate dielectrics.

However, such methods have not succeeded in solving the above-mentioned problems. For example, the silicon nitride layer or oxynitride layer between the high-k dielectric layer and the silicon substrate or the polysilicon gate electrode causes charge trapping with high interface state densities. Thus, such methods reduce channel mobility and degrade device performance. Further, the formation of the silicon nitride layer or the oxynitride layer requires a relatively large thermal budget.

Importantly, in the case of the silicon nitride layer, because the dielectric constant of silicon nitride is only about 1.5 times greater than that of silicon dioxide, it has been difficult to reduce an EOT, thus inhibiting the improvements in device performance.

Accordingly, a need still remains for an improved dielectric layer structure with a higher crystallization temperature and the method of manufacturing the same to improve the device performance by reducing the equivalent oxide thickness of the dielectric layer as well as improvement of the interface characteristics.

SUMMARY OF THE INVENTION

The present invention provides methods of forming a multi-layer dielectric layer structure for a semiconductor device. The multi-layer dielectric layer structure comprises a silicate interface layer and a high-k dielectric layer overlying the silicate interface layer.

According to one preferred embodiment of the present invention, the high-k dielectric layer has a dielectric constant greater than that of the silicate interface layer.

Preferably, the silicate interface layer is formed of a metal silicate material ($M_{1-x}Si_xO_2$) and the metal "M" can be hafnium (Hf), zirconium (Zr), tantalum (Ta), titanium (Ti) or aluminum (Al).

Preferably, the high-k dielectric layer comprises a metal oxide layer. The metal oxide layer preferably comprises an $HfO_2$ layer, a $ZrO_2$ layer, a $Ta_2O_3$ layer, an $Al_2O_3$ layer, a $TiO_2$ layer, an $Y_2O_3$ layer, or a BST layer, a PZT layer, or combinations thereof.

Preferably, the high-k dielectric layer comprises one or more ordered pairs of first and second layers.

Preferably, the first layer is formed of $HfO_2$, $Ta_2O_3$, $Y_2O_3$ or $ZrO_2$ and the second layer is formed of $Al_2O_3$.

According to one aspect of the present invention, the dielectric constant of the high-k dielectric layer can be optimized with a minimum net fixed charge.

Further, in accordance with the other aspect of the present invention, interface characteristics can be improved and the EOT can be maintained or reduced.

In addition, according to another aspect of the present invention, with a higher crystallization temperature realized by forming a multi-layer structure, each of whose layers is not more than the critical thickness, leakage current can be reduced, thereby improving device performance.

The foregoing and other objects, features and advantages of the invention will become more readily apparent from the following detailed description of a preferred embodiment of the invention that proceeds with reference to the accompanying drawings.

DETAILED DESCRIPTION

The present invention provides a noble dielectric layer structure and a method of manufacturing the same. In the following description, numerous specific details are set forth to provide a thorough understanding of the present invention. However, one having ordinary skill in the art should recognize that the invention can be practiced without these specific details. In some instances, well-known process steps, device structures, and techniques have not been shown in detail to avoid obscuring the present invention.

Although the invention is described in conjunction with gate dielectrics of a MOS transistor, the present invention is equally applicable to any dielectric for semiconductor devices, such as an inter-gate dielectric layer of non-volatile memory devices, or a dielectric layer of a storage capacitor, all of which are within the spirit and scope of the present invention.

The preferred embodiments of the present invention are best understood by referring to FIGS. 1–7 of the drawings, in which like reference designators are used for like features.

Figure 1A:
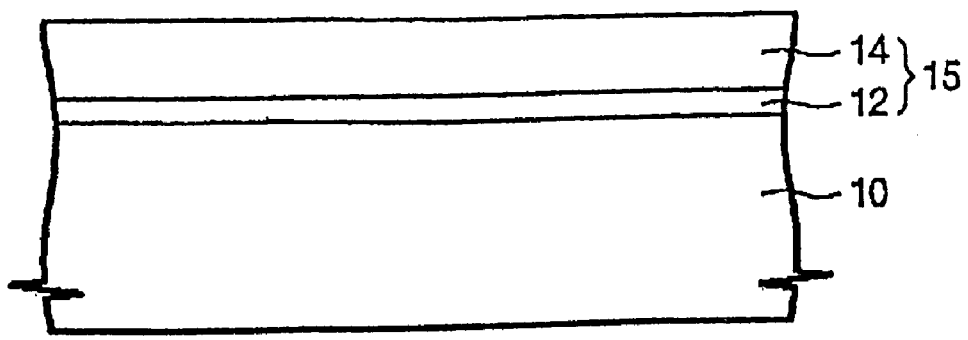
FIG. 1A is a cross-sectional view of a semiconductor device illustrating one embodiment according to the present invention.
Figure 1B:
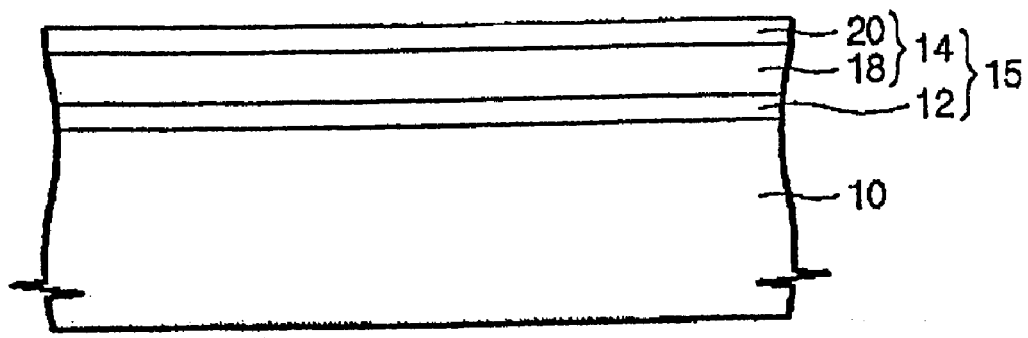
FIG. 1B is a cross-sectional view of a semiconductor device according to another embodiment of the present invention.
Figure 1C:
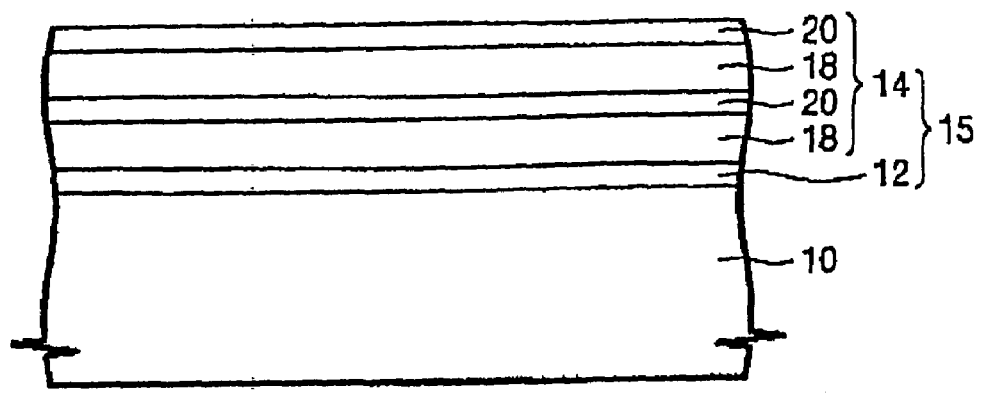
FIG. 1C is a cross-sectional view of a semiconductor device according to a further embodiment of the present invention.

Referring to FIGS. 1A–1C, according to the preferred embodiments of the present invention, a silicate interface layer 12 formed of a silicate material is deposited on a semiconductor substrate 10, e.g. a silicon substrate. The thickness of the silicate interface layer 12 is preferably in the range of approximately 5–10 angstroms. The dielectric constant of the silicate interface layer 12 is preferably greater than that of silicon nitride or oxynitride.

Then, a high-k dielectric layer 14 is formed on the silicate interface layer 12. The high-k dielectric layer 14 has a dielectric constant higher than that of $SiO_2$. Preferably, the high-k dielectric layer 14 has a dielectric constant greater than that of the silicate interface layer 12.

Here, the silicate interface layer 12 is preferably formed of metal silicate materials ($M_{1-x}Si_xO_2$). Here, the metal "M" can be hafnium (Hf), zirconium (Zr), tantalum (Ta), titanium (Ti) or aluminum (Al). However, this list is not intended to be exhaustive or to limit the invention. Any other material suitable for the present invention can be used within the sprit and scope of the present invention.

The silicate interface layer 12 substantially improves interface characteristics. For example, the silicate interface layer 12 substantially prevents the reaction between the high-k dielectric layer 14 and the semiconductor substrate 10. Because the silicate interface layer 12 is chemically stable when formed on silicon, an unnecessary interface layer such as silicon dioxide that would undesirably increases EOT substantially would not form.

Also, it is believed that the present invention reduces the interface trap density contrasted with the prior art methods. This will be further explained in the below description, by reference to FIGS. 5–6.

Importantly, in the prior art, when bulk $HfO_2$ or $ZrO_2$ layers are used for dielectrics, an uncontrolled natural silicate layer may be undesirably formed unable to control the composition of Si. Accordingly, the EOT cannot be optimized, e.g. maintained or effectively reduced. Further, the interface characteristics can degrade with increased interface trap density.

In contrast, in the present invention, when a controlled silicate interface layer is formed by methods such as atomic layer deposition (ALD) with the controlled Si composition x and a controlled thickness, the dielectric constant of the dielectric layer structure 15 can be optimized. Further, the interface characteristics can be substantially improved without the formation of an undesirable natural silicate layer.

Further, contrasted with the prior art, in which a silicon nitride oxidation barrier layer may have a dielectric constant of about 7, because the metal silicate interface layer 12 has a relatively high dielectric constant of about 10 to 12, the EOT can be maintained or reduced compared to such prior art methods.

In addition, it is believed that the metal silicate interface layer 12 can maintain a substantially amorphous state even under a high temperature of 900° C. during subsequent heat treatments. Thus, fewer grain boundaries are generated in the metal silicate interface layer 12, thereby reducing leakage current.

Preferably, as stated above, the metal silicate interface layer 12 may be formed using an ALD technique. Thus, a low thermal budget process is possible with the present invention contrasted with the prior art methods requiring a large thermal budget. Further, by using the ALD technique, a wider range of precursors can be used and a film may be formed having a tightly controlled thickness, which would not have been possible by traditional chemical vapor deposition (CVD).

The ALD technique for forming the metal silicate interface layer may be carried out by alternately and repeatedly performing pulsing and purging steps for a metal source, a silicon source and an oxygen source. In the case of the zirconium silicate interface layer 12, $ZrCl_4$ may be used as the metal source. Similarly, in the case of a hafnium silicate interface layer, $HfCl_4$ may be used as the metal source. Also, the silicon source may comprise $SiH_4$ or $SiCl_4H_2$ and the oxygen source may comprise $H_2O$ or ozone. Also, other precursors suitable for the present invention can be used within the sprit and scope of the present invention Alternatively, the metal silicate interface layer may be formed using a metalorganic chemical vapor deposition (MOCVD) technique or a reactive sputtering technique, if the MOCVD technique or the reactive sputtering technique provides the similar level of control as the ALD technique in terms of thickness or composition. The MOCVD technique can be performed using precursors such as $Hf(O-Si-R_3)_4$ or $Zr(O-Si-R_3)_4$, $R=C_2H_5$. Also, Hf source such as Hf—t-butoxide, Zr source such as Zr-t-butoxide, and Si source such as tetraethoxyorthosilane or tetraethylorthosilicate (TEOS) can be used.

Now turning to the formation of the high-k dielectric layer 14, the high-k dielectric layer 14 preferably comprises a metal oxide layer. The metal oxide layer may be an $HfO_2$ layer, a $ZrO_2$ layer, a $Ta_2O_3$ layer, an $Al_2O_3$ layer, a $TiO_2$ layer, a $Y_2O_3$ layer, a BST PZT layer, or combinations thereof.

The metal oxide layer may be formed using an ALD technique, a MOCVD technique or a reactive sputtering technique. The reactive sputtering technique is performed by injecting an oxygen gas into the process chamber during the deposition of the metal. Also, the metal oxide layer can be formed by depositing a metal layer and annealing the metal layer in an oxygen ambient.

According to one embodiment of the present invention, the metal of the silicate interface layer 12 is preferably the same as the metal of the metal oxide layer (high-k dielectric layer 14). For example, the dielectric layer structure 15 comprises a hafnium silicate interface layer and a hafnium oxide layer, which are sequentially stacked.

On the other hand, if the silicate interface layer 12 is formed of zirconium silicate, the overlying high-k dielectric layer 14 is preferably formed of $ZrO_2$. In these cases, because the metal of the silicate interface layer 12 is the same as the metal contained in the metal oxide layer (high-k dielectric layer 14), the interface characteristics can be improved due to electrical coherency between the silicate interface layer 12 and the overlying high-k dielectric layer 14.

Also, if the hafnium oxide layer is doped with aluminum, it can prevent the hafnium oxide layer from being crystallized during a subsequent thermal process.

As stated above, the dielectric constant of the metal silicate interface layer 12 can be controlled by varying the composition rate of the silicon. In the present invention, it has been determined that the metal silicate materials $(M_{1-x}Si_xO_2)$ show the optimum value of dielectric constant when x is approximately 0.30–0.99.

Figure 2:
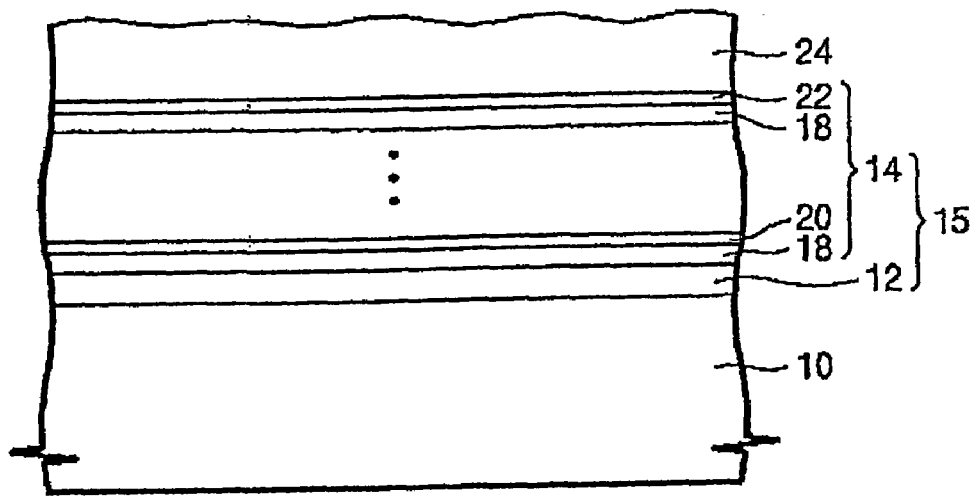
FIG. 2 is a cross-sectional view of a semiconductor device according to yet another embodiment of the present invention.

According to another embodiment of the present invention, it is preferable that the high-k dielectric layer 14 comprises a multi-layer structure, as shown in FIGS. 1B, 1C and 2.

Figure 3:
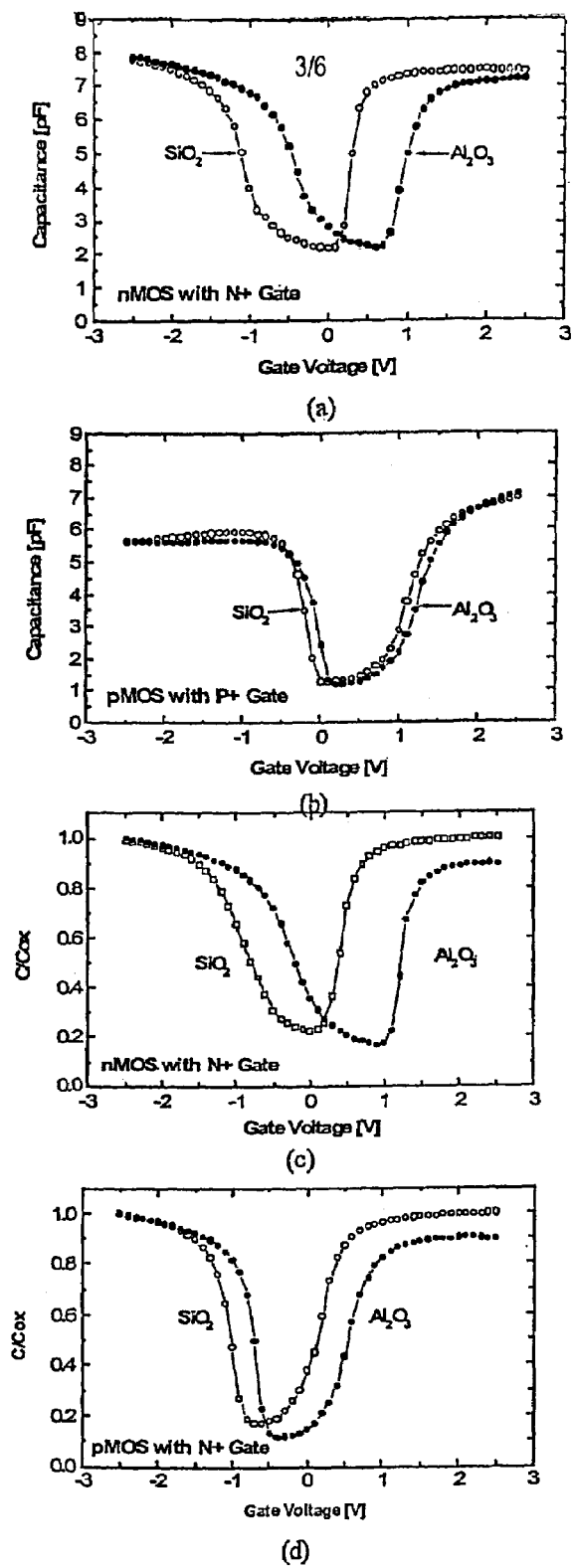
FIG. 3 is a charge-to-voltage (C-V) curve of $Al_2O_3$ MOS capacitor.
Figure 4:
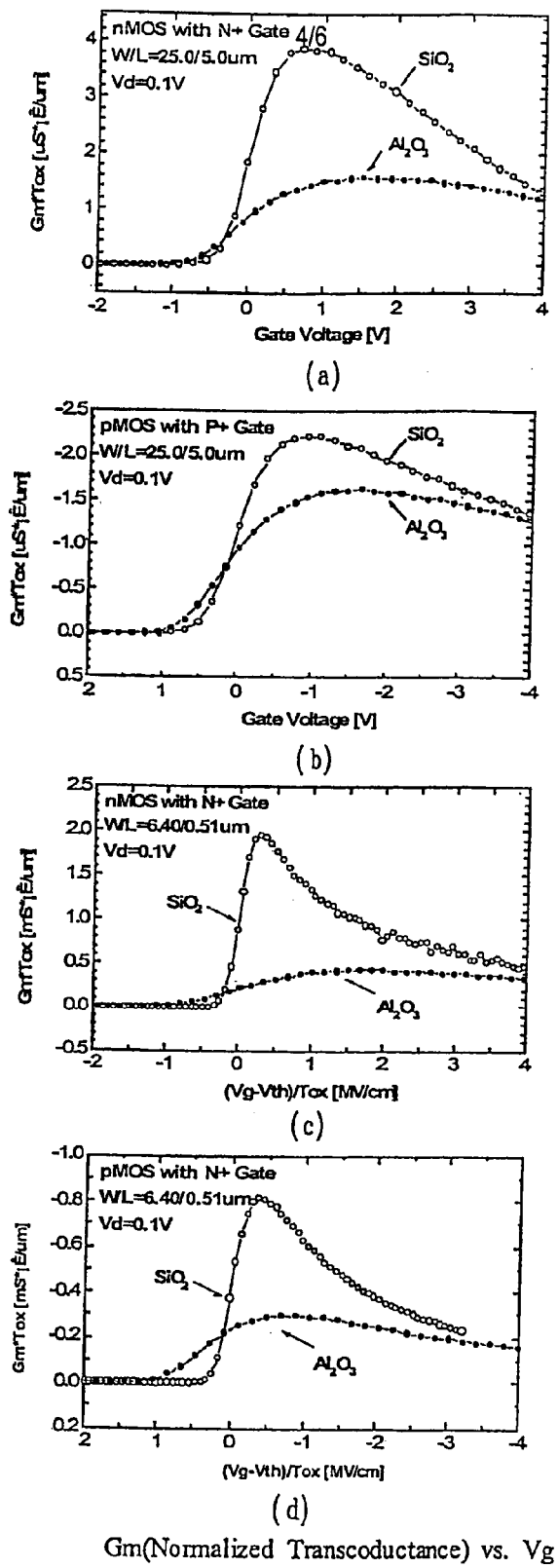
FIG. 4 is a graph illustrating normalized transconductance in accordance with the gate fabrication.

Referring to FIGS. 1B, 1C and 2, the high-k dielectric layer 14 is formed by the ordered (alternate) stacking of two kinds of material layers, e.g., $HfO_2$ or $ZrO_2$ layers and an $Al_2O_3$ layer. Here, the $Al_2O_3$ layer has much negative fixed charges as compared to the $SiO_2$ layer, as shown in FIG. 3 indicating low frequency C-V plots to the MOS structure having only an $Al_2O_3$ layer as a high-k dielectric. That is to say, the flatband voltage of the $Al_2O_3$ layer is shifted toward the direction of positive gate voltage. This explains the existence of the negative fixed charges leading to a low transconductance in a MOS structure, as shown in FIG. 4. On the contrary, the metal oxide layer such as the $HfO_2$ layer or the $ZrO_2$ layer contains much positive fixed charges therein. Thus, although the present invention is not limited to any particular principle of operation, the applicants believe that the negative fixed charges in the $Al_2O_3$ layer can be compensated by the positive fixed charges in the metal oxide layer such as the $HfO_2$ layer or the $ZrO_2$ layer. Thus, it is possible to minimize the net fixed charge of the high-k dielectric layer by alternately stacking the metal oxide layer such as the $HfO_2$ layer or the $ZrO_2$ layer and the $Al_2O_3$ layer.

According to the other embodiment of the present invention, it is preferable that the upper most layer 22 (See FIG. 2) of the high-k dielectric layer 14 be formed of $Al_2O_3$. This is because the heat of formation of the $Al_2O_3$ layer is greater than that of the $ZrO_2$ layer or the $HfO_2$ layer. For example, the heat of formation of the $Al_2O_3$ layer is $-1678$ kJ/mol, and the heat of formations of the $ZrO_2$ layer and the $HfO_2$ layer are $-1100$ kJ/mol and $-1122$ kJ/mol, respectively. Thus, even though a polysilicon layer 24 is directly formed on the $Al_2O_3$ layer to form a gate electrode, the $Al_2O_3$ layer does not react with the polysilicon layer 24. Therefore, in the present invention, it is possible to improve the interface characteristics between the high-k dielectric layer and the gate electrode.

For these reasons, a polysilicon gate electrode can be used with the present invention without using a metal gate electrode. Accordingly, various costs can be saved using existing integration schemes.

On the other hand, if the silicate interface layer 12 is formed of zirconium silicate, the overlying high-k dielectric layer 14 is preferably formed by alternately stacking the $ZrO_2$ layer and the $Al_2O_3$ layer. In this case, because the metal of the silicate interface layer 12 is the same as the metal contained in the metal oxide layer (high-k dielectric layer 14), the interface characteristics can be improved due to electrical coherency between the silicate interface layer 12 and the overlying high-k dielectric layer 14 as described above. Similarly, if the silicate interface layer 12 is formed of hafnium silicate, the high-k dielectric layer 14 is preferably formed by alternately stacking the $HfO_2$ layer and the $Al_2O_3$ layer.

According to one aspect of the present invention, a crystallization temperature can be lowered forming the high-k dielectric layer 14 comprising one or more pairs of, alternating first layer 18 formed, for example, of $HfO_2$, $Ta_2O_3$, $Y_2O_3$ or $ZrO_2$ and second layer 22 formed, for example, of $Al_2O_3$ as illustrated in FIGS. 1B,1C, and 2.

Preferably, the thicknesses of the first and second layers 18, 20 are in the range of approximately 2 to approximately 60 angstroms (critical thickness). More preferably, the thicknesses of the first and second layers are approximately 10 and 5 angstroms, respectively. It is contemplated that if the thicknesses of the first and second layers 18, 20 are within this range, the crystallization temperature can be lowered as compared to a bulk dielectric layer.

Conventionally, for example, in the case of an $HfO_2$ bulk dielectric layer, the crystallization temperature is about 600–800° C. During activation, the process temperature can be over 800–850° C. when using a furnace and the process temperature can be 900° C. when using a rapid thermal anneal. Thus, the HfO$_2$ bulk dielectric layer can be easily crystallized during those thermal processes, thereby increasing leakage current.

But, with the high-k dielectric layer 14 described above in accordance with the present invention, the crystallization temperature of the high-k dielectric layer 14 can be reduced compared to the prior art, thus reducing leakage current. Here, 2 angstroms is a basic thickness of one atomic layer, and 60 angstroms represents an upper thickness limit that prevents a popping phenomenon during a subsequent annealing process. As is known in the art, hydroxyl radicals trapped in dielectric layers during the formation can pop therefrom upon subsequent annealing, thereby damaging, e.g. leaving a hole in the dielectric layers. If such a popping phenomenon occurs, subsequent processing steps such as gate poly deposition can be significantly inhibited.

Preferably, the thickness of the second layer 20 is approximately one half the thickness of the first layer 18 because the amount of fixed charge in Al$_2$O$_3$ is thought to be approximately two times more than that of HfO$_2$ or ZrO$_2$.

Also, the total thickness of the second layer 20 is preferably not more than one third of the total thickness of the high-k dielectric layer 14. This is especially true if the second layer (20) is HfO$_2$. The dielectric constant of HfO$_2$ (k=30) is approximately three times the dielectric constant of Al$_2$O$_3$ (k=10). Thus, the thickness of Al$_2$O$_3$ is preferably approximately 33% of the total thickness of the high-k dielectric layer 14 to achieve minimization of net fixed charge and high dielectric constant of not less than k=20.

It is to be noted that silicon substrate 10 shown in FIGS. 1A–1C can be a semiconductor or a conductor, such as doped polysilicon, within the scope of the present invention. Further, the polysilicon layer 24 shown in FIG. 2 can be a part of a gate stack or an upper electrode of capacitors for memory devices.

Figure 5:
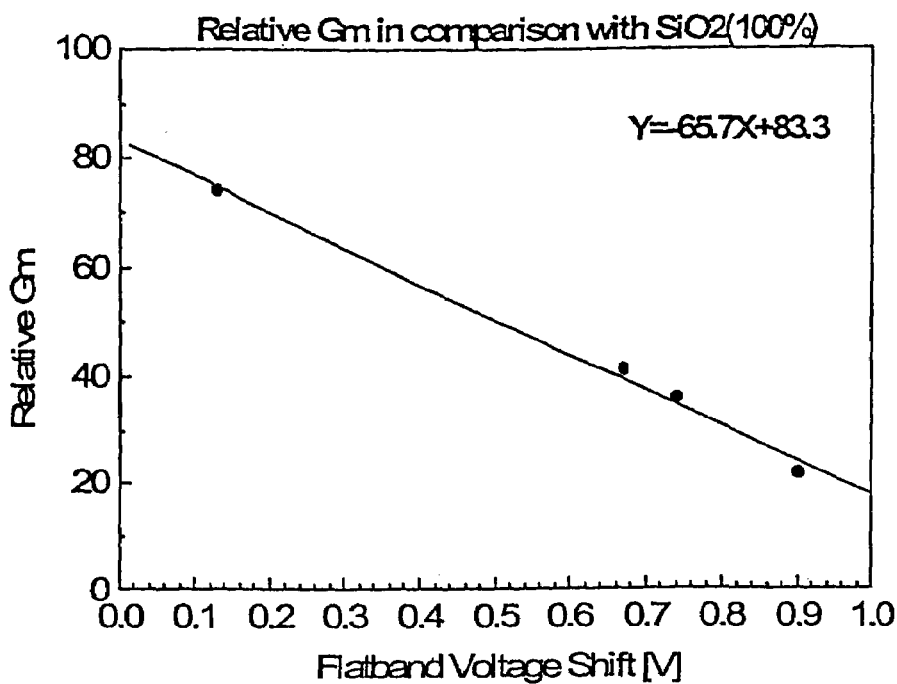
FIG. 5 is a graph contrasting the flatband voltage shift of $SiO_2$ and $Al_2O_3$.
Figure 6:
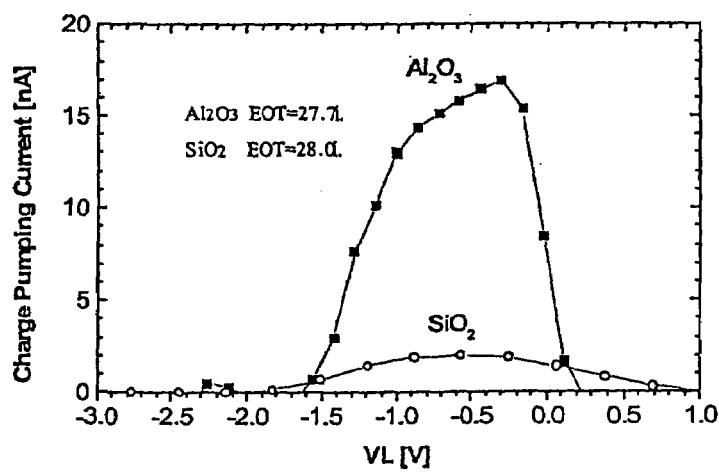
FIG. 6 is a graph contrasting the Charge Pumping Current Icp of $SiO_2$ and $Al_2O_3$ depending Gate Base level VL.

FIG. 5 is a graph illustrating a relationship between the transconductance and the flatband voltage in a MOS structure including the Al$_2$O$_3$ layer as the high-k dielectric. Here, the reference is the MOS structure having a SiO$_2$ layer as the dielectric layer.

The transconductance of the MOS structure is affected by the fixed charge in the high-k dielectric. In other words, the greater the fixed charge, the lower the transconductance. In particular, the transconductance in a medium gate field is directly affected by coulomb scattering due to the fixed charge.

In this respect, in the prior art, the problem of the fixed charge leading to coulomb scattering that reduces channel mobility has not been well considered and addressed. However, in the present invention, the applicants appreciate such problem and thus effectively address the fixed-charge problem by designing the novel dielectric layer structure 15 as described above by compensating the negative fixed charges in the Al$_2$O$_3$ layer with the positive fixed charges in the metal oxide layer such as the HfO$_2$ layer or the ZrO$_2$ layer.

Further referring to FIG. 5, even though the amount of the flatband voltage shift is 0 volt, the transconductance of the MOS structure including the Al$_2$O$_3$ layer is still less than that of the reference MOS structure. This difference is due to the interface trap density. The interface trap density can be calculated using a charge pumping current shown in FIG. 6. Such interface trap density can be reduced by introducing the metal silicate interface layer 12 between the silicon substrate 10 and the high-k dielectric layer 14.

Figure 7:
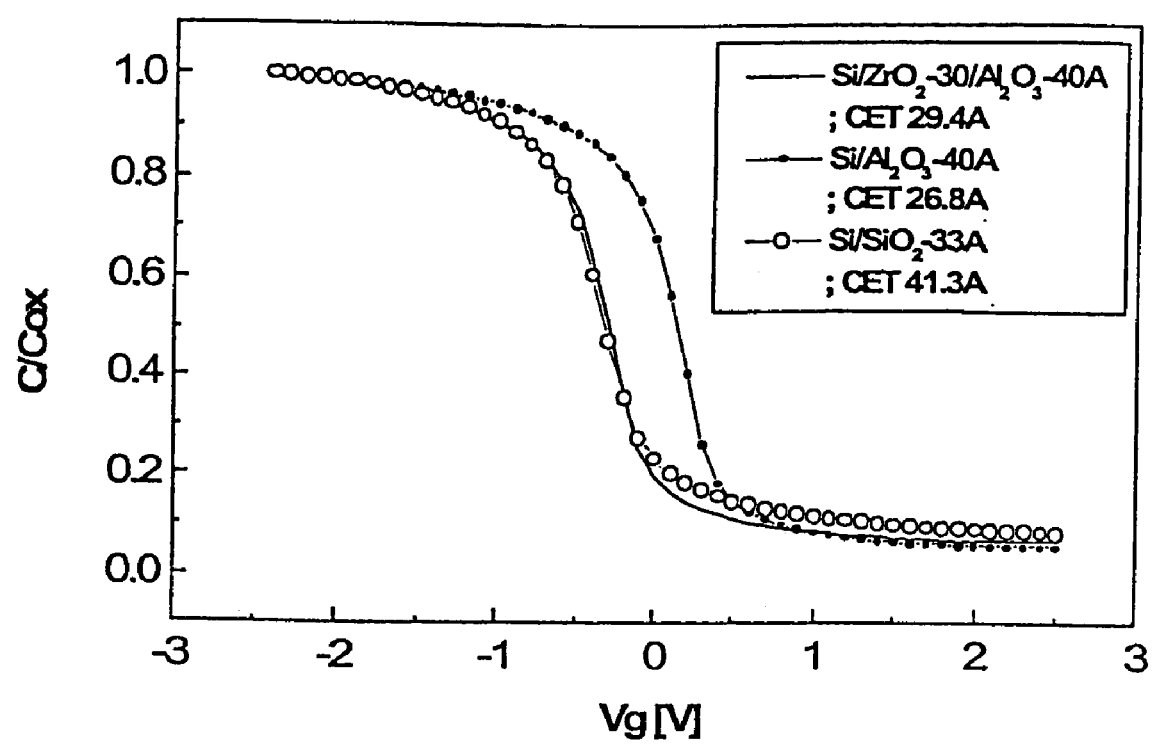
FIG. 7 is a graph contrasting C-V curves of a $ZrO_2/Al_2O_3$ stack and a silicon only-gate layer.

Referring to FIG. 7, the C-V curve of the MOS structure according to the present invention (ZrO$_2$ layer/ Al$_2$O$_3$ layer) is almost the same as that of the conventional MOS structure (SiO$_2$ layer) as shown. In other words, the flatband voltage of the MOS structure according to the present invention is nearly the same as that of the conventional MOS structure. Therefore, according to one aspect of the present invention, it is possible to minimize the fixed charge of the high-k dielectric layer 14.

In conclusion, by forming a multi-layered high-k dielectric layer 14, for example, comprising HfO$_2$ (k=25–30) or ZrO$_2$ (k=20–25) alternatingly stacked with Al$_2$O$_3$, the dielectric constant of the high-k dielectric layer 14 can be optimized to over k=20 with a minimum net fixed charge.

Further, with the present invention, interface characteristics can be improved and the EOT can be maintained or reduced contrasted with the prior art dielectric layer structure such as one incorporating silicon nitride or oxynitride interface layers, or a silicate bulk layer without an interface layer. In other words, by combining the silicate interface layer 12 of which dielectric constant is preferably greater than that of silicon nitride or oxynitride along with a high-k dielectric layer 14, a low EOT with improved interface characteristics can be achieved.

In addition, with a higher crystallization temperature realized by forming a multi-layer structure, i.e. nanolaminate structure, each of whose layers is not more than the critical thickness, leakage current can be reduced, thereby improving device performance.

Thus, the present invention provides a dielectric layer structure having the advantages of silicon dioxide but without the disadvantages of the prior art.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method of forming a multi-layer structure for a semiconductor device, comprising:
   forming a silicate interface layer; and
   forming a high-k dielectric layer overlying the silicate interface layer, wherein said forming the high-k dielectric layer comprises:
   forming a first layer having a first predefined charge;
   forming a second layer overlying the first layer, the second layer having a second predefined charge opposite to that of the first layer.

2. The method of claim 1, wherein the first predefined charge is a negative fixed charge and the second predefined charge is a positive fixed charge.

3. The method of claim 1, wherein said forming the silicate interface layer is performed by an ALD technique, a MOCVD technique or a reactive sputtering technique.

4. The method of claim 1, wherein the silicate interface layer is formed to a thickness of approximately 5–10 angstroms.

5. The method of claim 1, which further comprises forming one or more first and second layers.

6. The method of claim 5, wherein the upper most layer is Al$_2$O$_3$.

7. The method of claim 1, wherein the silicate interface layer is formed of a metal silicate material (M$_{1-x}$Si$_x$O$_2$).

8. The method of claim 7, wherein x is approximately 0.30–0.99, and wherein the metal "M" is selected from the group consisting of hafnium (Hf), zirconium (Zr), tantalum (Ta), titanium (Ti) and aluminum (Al).

9. The method of claim 1, wherein the high-k dielectric layer is a metal oxide layer selected from the group consisting of an $HfO_2$ layer, a $ZrO_2$ layer, a $Ta_2O_3$ layer, an $Al_2O_3$ layer, a $TiO_2$ layer, an $Y_2O_3$ layer, a BST layer, a BZT layer, and combinations thereof.

10. The method of claim 9, wherein the metal oxide layer is formed using an ALD technique, a MOCVD technique or a reactive sputtering technique.

11. The method of claim 9, wherein the silicate interface layer is formed of a metal silicate material, and wherein the metal of the silicate interface layer is the same as the metal of the metal oxide layer.

12. A method of forming a semiconductor device, comprising:

forming a silicate interface layer on a semiconductor substrate; and forming a high-k dielectric layer overlying the silicate interface layer, wherein the high-k dielectric layer has a dielectric constant greater than that of the silicate interface layer.

13. The method of claim 12, wherein the silicate interface layer has a dielectric constant greater than that of silicon nitride or silicon oxynitride.

14. The method of claim 12, wherein the silicate interface layer is formed of a metal silicate material ($M_{1-x}Si_xO_2$).

15. The method of claim 14, wherein x is approximately 0.30–0.99, and wherein the metal "M" is selected from the group consisting of hafnium (Hf), zirconium (Zr), tantalum (Ta), titanium (Ti) and aluminum (Al).

16. The method of claim 12, wherein the high-k dielectric layer is a metal oxide layer selected from the group consisting of an $HfO_2$ layer, a $ZrO_2$ layer, a $Ta_2O_3$ layer, an $Al_2O_3$ layer, a $TiO_2$ layer, an $Y_2O_3$ layer, a BST layer, a PZT layer, and combinations thereof.

17. The method of claim 16, wherein the silicate interface layer is formed of a metal silicate material, and wherein the metal of the silicate interface layer is the same as the metal of the metal oxide layer.

18. The method of claim 12, wherein said forming the high-k dielectric layer comprises:

forming a first layer having a first controlled thickness; and forming a second layer overlying the first layer, the second layer having a second controlled thickness.

19. The method of claim 18, wherein the first and second controlled thicknesses are in the range of approximately 2–60 angstroms.

20. The method of claim 18, wherein a total thickness of the second layer is not more than approximately one third of the total thickness of the high-k dielectric layer.

21. The method of claim 18, wherein the second layer is approximately one half the thickness of the first layer.

22. The method of claim 18, wherein the first layer is formed of $HfO_2$, $Ta_2O_3$, $Y_2O_3$ or $ZrO_2$ and the second layer is formed of $Al_2O_3$.

* * * * *

UNITED STATES PATENT AND TRADEMARK OFFICE
CERTIFICATE OF CORRECTION

PATENT NO. : 7,112,539 B2  Page 1 of 1
APPLICATION NO. : 10/999608
DATED : September 26, 2006
INVENTOR(S) : Jongho Lee et al.

It is certified that error appears in the above-identified patent and that said Letters Patent is hereby corrected as shown below:

Column 5, line 11, the word "sprit" should read -- spirit --.

Signed and Sealed this

Nineteenth Day of August, 2008

JON W. DUDAS
*Director of the United States Patent and Trademark Office*